(12) United States Patent
Chang et al.

(10) Patent No.: US 8,623,728 B2
(45) Date of Patent: Jan. 7, 2014

(54) METHOD FOR FORMING HIGH GERMANIUM CONCENTRATION SIGE STRESSOR

(75) Inventors: Chih-Hao Chang, Chu-Bei (TW); Jeff J. Xu, Jhubei (TW); Chien-Hsun Wang, Hsinchu (TW); Chih Chieh Yeh, Taipei (TW); Chih-Hsiang Chang, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 104 days.

(21) Appl. No.: 12/831,842

(22) Filed: Jul. 7, 2010

(65) Prior Publication Data

US 2011/0024804 A1   Feb. 3, 2011

Related U.S. Application Data

(60) Provisional application No. 61/229,253, filed on Jul. 28, 2009.

(51) Int. Cl.
*H01L 21/336* (2006.01)
*H01L 21/31* (2006.01)
*H01L 21/469* (2006.01)
*H01L 21/00* (2006.01)

(52) U.S. Cl.
USPC ............ 438/285; 438/308; 438/773; 438/796

(58) Field of Classification Search
None
See application file for complete search history.

(56) References Cited

U.S. PATENT DOCUMENTS

| | | | |
|---|---|---|---|
| 5,581,202 A | 12/1996 | Yano et al. |
| 5,658,417 A | 8/1997 | Watanabe et al. |
| 5,767,732 A | 6/1998 | Lee et al. |
| 5,963,789 A | 10/1999 | Tsuchiaki |

(Continued)

FOREIGN PATENT DOCUMENTS

| | | |
|---|---|---|
| CN | 1945829 | 4/2004 |
| CN | 101179046 | 5/2005 |

(Continued)

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

(Continued)

*Primary Examiner* — Hoang-Quan Ho
(74) *Attorney, Agent, or Firm* — Lowe Hauptman & Ham, LLP (57) ABSTRACT

A method for producing a SiGe stressor with high Ge concentration is provided. The method includes providing a semiconductor substrate with a source area, a drain area, and a channel in between; depositing the first SiGe film layer on the source area and/or the drain area; performing a low temperature thermal oxidation, e.g., a high water vapor pressure wet oxidation, to form an oxide layer at the top of the first SiGe layer and to form the second SiGe film layer with high Ge percentage at the bottom of the first SiGe film layer without Ge diffusion into the semiconductor substrate; performing a thermal diffusion to form the SiGe stressor from the second SiGe film layer, wherein the SiGe stressor provides uniaxial compressive strain on the channel; and removing the oxide layer. A Si cap layer can be deposited on the first SiGe film layer prior to performing oxidation.

20 Claims, 5 Drawing Sheets

(56) References Cited

U.S. PATENT DOCUMENTS

| | | | |
|---|---|---|---|
| 6,065,481 A | 5/2000 | Fayfield et al. | |
| 6,121,786 A | 9/2000 | Yamagami et al. | |
| 6,173,365 B1 | 1/2001 | Chang | |
| 6,299,724 B1 | 10/2001 | Fayfield et al. | |
| 6,352,942 B1* | 3/2002 | Luan et al. | 438/770 |
| 6,503,794 B1 | 1/2003 | Matsuda et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1* | 3/2006 | Thean et al. | 438/285 |
| 7,026,232 B1 | 4/2006 | Koontz et al. | |
| 7,067,400 B2* | 6/2006 | Bedell et al. | 438/479 |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,208,357 B2* | 4/2007 | Sadaka et al. | 438/166 |
| 7,241,647 B2* | 7/2007 | Sadaka et al. | 438/149 |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,348,260 B2* | 3/2008 | Ghyselen | 438/458 |
| 7,351,622 B2 | 4/2008 | Buh et al. | |
| 7,358,166 B2* | 4/2008 | Agnello et al. | 438/509 |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,427,779 B2* | 9/2008 | Damlencourt et al. | 257/63 |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,557,018 B2* | 7/2009 | Nakaharai et al. | 438/479 |
| 7,598,145 B2* | 10/2009 | Damlencourt et al. | 438/285 |
| 7,605,449 B2 | 10/2009 | Liu et al. | |
| 7,682,911 B2 | 3/2010 | Jang et al. | |
| 7,736,988 B2* | 6/2010 | Ghyselen et al. | 438/406 |
| 7,759,228 B2* | 7/2010 | Sugiyama et al. | 438/479 |
| 7,795,097 B2 | 9/2010 | Pas | |
| 7,798,332 B1 | 9/2010 | Brunet | |
| 7,820,513 B2 | 10/2010 | Hareland et al. | |
| 7,821,067 B2* | 10/2010 | Thean et al. | 257/347 |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2* | 4/2011 | Meunier-Beillard et al. | 438/308 |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 8,211,761 B2* | 7/2012 | Tan et al. | 438/199 |
| 2003/0080361 A1 | 5/2003 | Murthy et al. | |
| 2003/0109086 A1 | 6/2003 | Arao | |
| 2003/0207555 A1* | 11/2003 | Takayanagi et al. | 438/590 |
| 2003/0234422 A1 | 12/2003 | Wang et al. | |
| 2004/0075121 A1 | 4/2004 | Yu et al. | |
| 2004/0129998 A1 | 7/2004 | Inoh et al. | |
| 2004/0192067 A1* | 9/2004 | Ghyselen et al. | 438/763 |
| 2004/0219722 A1 | 11/2004 | Pham et al. | |
| 2004/0241398 A1* | 12/2004 | Notsu et al. | 428/195.1 |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1* | 4/2005 | Chen et al. | 257/350 |
| 2005/0098234 A1* | 5/2005 | Nakaharai et al. | 148/33.3 |
| 2005/0153490 A1 | 7/2005 | Yoon et al. | |
| 2005/0170593 A1 | 8/2005 | Kang et al. | |
| 2005/0208780 A1* | 9/2005 | Bedell et al. | 438/796 |
| 2005/0212080 A1 | 9/2005 | Wu et al. | |
| 2005/0221591 A1* | 10/2005 | Bedell et al. | 438/479 |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1* | 3/2006 | Thean et al. | 438/285 |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1* | 7/2006 | Chen et al. | 257/188 |
| 2006/0153995 A1 | 7/2006 | Narwankar et al. | |
| 2006/0166475 A1* | 7/2006 | Mantl | 438/590 |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |
| 2007/0029576 A1 | 2/2007 | Nowak et al. | |
| 2007/0048907 A1 | 3/2007 | Lee et al. | |
| 2007/0076477 A1 | 4/2007 | Hwang et al. | |
| 2007/0093010 A1 | 4/2007 | Mathew et al. | |
| 2007/0093036 A1 | 4/2007 | Cheng et al. | |
| 2007/0096148 A1 | 5/2007 | Hoentschel et al. | |
| 2007/0108481 A1* | 5/2007 | Thean et al. | 257/288 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0131969 A1 | 6/2007 | Sanuki et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0166929 A1* | 7/2007 | Matsumoto et al. | 438/285 |
| 2007/0178637 A1 | 8/2007 | Jung et al. | |
| 2007/0207598 A1* | 9/2007 | Damlencourt et al. | 438/479 |
| 2007/0221956 A1 | 9/2007 | Inaba | |
| 2007/0236278 A1 | 10/2007 | Hur et al. | |
| 2007/0241414 A1 | 10/2007 | Narihiro | |
| 2007/0247906 A1 | 10/2007 | Watanabe et al. | |
| 2007/0254440 A1* | 11/2007 | Daval | 438/285 |
| 2008/0001171 A1 | 1/2008 | Tezuka et al. | |
| 2008/0036001 A1 | 2/2008 | Yun et al. | |
| 2008/0042209 A1* | 2/2008 | Tan et al. | 257/369 |

(56) References Cited

U.S. PATENT DOCUMENTS

| | | |
|---|---|---|
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1* | 2/2009 | Teo et al. ............... 257/190 |
| 2009/0066763 A1 | 3/2009 | Fujii et al. |
| 2009/0155969 A1* | 6/2009 | Chakravarti et al. ........ 438/285 |
| 2009/0166625 A1* | 7/2009 | Ting et al. ............... 257/51 |
| 2009/0181477 A1 | 7/2009 | King et al. |
| 2009/0200612 A1 | 8/2009 | Koldiaev |
| 2009/0239347 A1* | 9/2009 | Ting et al. ............... 438/285 |
| 2009/0261381 A1* | 10/2009 | Kim et al. ............... 257/190 |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 100481345 | 4/2009 |
| CN | 1011459116 | 6/2009 |
| JP | 2007-194336 | 8/2007 |
| JP | 2007-214481 | 8/2007 |
| JP | 2008182147 | 8/2008 |
| JP | 2009517867 | 4/2009 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Office Action dated May 2, 2012 from corresponding application No. CN 201010196345.0.

Office Action dated May 4, 2012 from corresponding application No. CN 201010243667.6.

Office Action dated Dec. 18, 2012 from corresponding application No. JP 2010-169487.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the Internet <URL:http://tsmc.com/english/dedicatedFoundry/technology/90nm.htm, retrieved on Jun. 9, 2012.

Merriam Webster definition of substantially retrieved from the Internet <URL:http://www.merriam-webster.com/dictionary/substantial>, retrieved on Apr. 16, 2012.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Office Action dated Jun. 25, 2013 from corresponding application No. JP 2010-169487.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Office Action dated Jul. 31, 2013 from corresponding application No. TW099124883.

* cited by examiner

METHOD FOR FORMING HIGH GERMANIUM CONCENTRATION SIGE STRESSOR

CROSS-REFERENCE TO RELATED APPLICATIONS

The present application claims priority of U.S. Application Ser. No. 61/229,253, filed on Jul. 28, 2009, which is incorporated herein by reference in its entirety.

The present application is related to U.S. patent application Ser. Nos. 12/707,788, filed on Feb. 18, 2010, titled MEMORY POWER GATING CIRCUIT AND METHODS; 12/758,426, filed on Apr. 12, 2010, titled FINFETS AND METHODS FOR FORMING THE SAME; 12/731,325, filed on Mar. 25, 2010, titled ELECTRICAL FUSE AND RELATED APPLICATIONS; 12/724,556, filed on Mar. 16, 2010, titled ELECTRICAL ANTI-FUSE AND RELATED APPLICATIONS; 12/757,203, filed on Apr. 9, 2010, titled STI STRUCTURE AND METHOD OF FORMING BOTTOM VOID IN SAME; 12/797,839, filed on Jun. 10, 2010, titled FIN STRUCTURE FOR HIGH MOBILITY MULTIPLE-GATE TRANSISTOR; 12/831,842, filed on Jul. 7, 2010, titled METHOD FOR FORMING HIGH GERMANIUM CONCENTRATION SiGe STRESSOR; 12/761,686, filed on Apr. 16, 2010, titled FINFETS AND METHODS FOR FORMING THE SAME; 12/766,233, filed on Apr. 23, 2010, titled FIN FIELD EFFECT TRANSISTOR; 12/757,271, filed on Apr. 9, 2010, titled ACCUMULATION TYPE FINFET, CIRCUITS AND FABRICATION METHOD THEREOF; 12/694,846, filed on Jan. 27, 2010, titled INTEGRATED CIRCUITS AND METHODS FOR FORMING THE SAME; 12/638,958, filed on Dec. 14, 2009, titled METHOD OF CONTROLLING GATE THICKNESS IN FORMING FINFET DEVICES; 12/768,884, filed on Apr. 28, 2010, titled METHODS FOR DOPING FIN FIELD-EFFECT TRANSISTORS; 12/731,411, filed on Mar. 25, 2010, titled INTEGRATED CIRCUIT INCLUDING FINFETS AND METHODS FOR FORMING THE SAME; 12/775,006, filed on May 6, 2010, titled METHOD FOR FABRICATING A STRAINED STRUCTURE; 12/886,713, filed Sep. 21, 2010, titled METHOD OF FORMING INTEGRATED CIRCUITS; 12/941,509, filed Nov. 8, 2010, titled MECHANISMS FOR FORMING ULTRA SHALLOW JUNCTION; 12/900,626, filed Oct. 8, 2010, titled TRANSISTOR HAVING NOTCHED FIN STRUCTURE AND METHOD OF MAKING THE SAME; 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

This disclosure relates generally to integrated circuits, and more particularly, to a SiGe source-drain stressor in a semiconductor transistor structure.

BACKGROUND

Strain engineering is employed in semiconductor manufacturing to enhance device performance. Performance benefits are achieved by modulating strain in the transistor channel, which enhances electron mobility (or hole mobility) and thereby conductivity through the channel.

In CMOS technologies, PMOS and NMOS respond differently to different types of strain. Specifically, PMOS performance is best served by applying compressive strain to the channel, whereas NMOS receives benefit from tensile strain. $SiGe(Si_{1-x}Ge_x)$, consisting of any molar ratio of silicon and germanium, is commonly used as a semiconductor material in integrated circuits (ICs) as a strain-inducing layer for strained silicon in CMOS transistors.

Strained silicon is a layer of silicon in which the silicon atoms are stretched beyond their normal inter atomic distance. This can be accomplished by putting the layer of silicon over a substrate of silicon germanium (SiGe), for example. As the atoms in the silicon layer align with the atoms of the underlying silicon germanium layer, which are arranged farther apart with respect to those of a bulk silicon crystal, the links between the silicon atoms become stretched—thereby leading to strained silicon.

Currently, the PMOS strain is realized by undercutting the source/drain area and epitaxially growing SiGe film in the undercut region. The larger lattice constant of the SiGe film provides the uniaxial strain to the Si channel. The higher the Ge concentration, the larger the strain and thus better performance. However, the Ge incorporation into the SiGe film is limited by the epitaxial process. Very high Ge concentration SiGe film is difficult to realize using the conventional epitaxial method, which is extremely sensitive to surface preparation, pre-cursors used and growth conditions. It is challenging to meet the ever-increasing Ge concentration requirement and maintain proper control of the SiGe profile for the SiGe source/drain (S/D) in PMOS with epitaxial growth.

BRIEF DESCRIPTION OF THE DRAWINGS

For a more complete understanding of exemplary embodiments of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for producing a SiGe stressor with high Ge concentration is provided. This method converts a SiGe film with low Ge concentration into a SiGe film with very high Ge concentration, without the need to epitaxially form a high Ge concentration source/drain (S/D). By having a separate oxidation step and diffusion step for the condensation process, high Ge concentration SiGe profile can be formed and properly controlled. This method is applicable to both planar and FinFET devices on either bulk Si or SOI (silicon on insulator) substrate. Throughout the various views and illustrative embodiments of the present invention, like reference numbers are used to designate like elements.

Figure 1A:
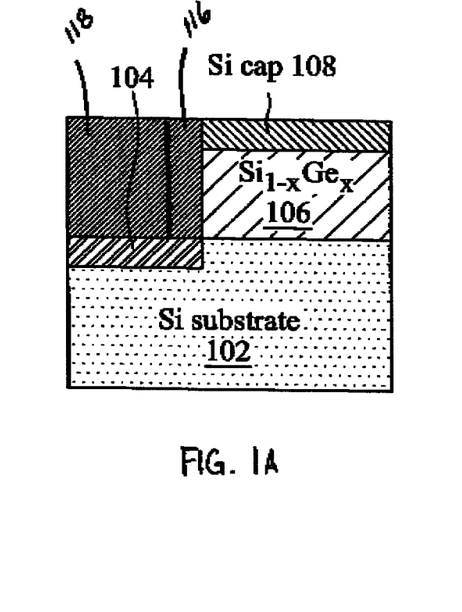
FIG. 1A-FIG. 1C illustrate an exemplary process for SiGe stressor with high Ge concentration according to one embodiment of this invention.
Figure 1B:
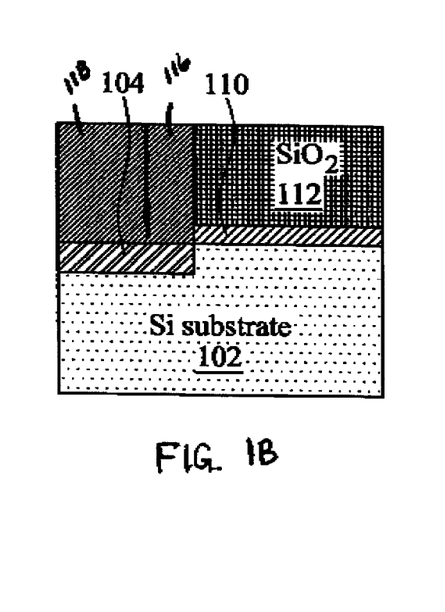
Figure 1C:
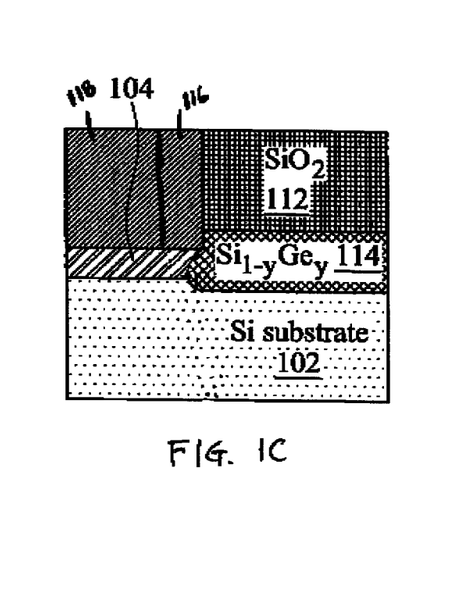

FIGS. 1A-1C illustrate an exemplary process for a SiGe stressor with high Ge concentration. In FIG. 1A, a SiGe film layer 106 and a Si cap layer 108 are deposited on the Si substrate 102 (the substrate 102 can also be SiGe substrate or relaxed SiGe film on Si substrate) beside spacer layer 116 in the S/D area. The channel area 104 below the gate 118 can comprise Si or SiGe channel. The Si cap layer 108 serves as the starting point for oxidation. The oxide quality of a SiGe film in general can be poor and its oxidation front can be hard to control without the Si cap layer 108. Having the Si cap layer 108 helps to form a uniform oxide layer 112 (shown in FIG. 1B) to begin with and makes the overall condensation profile easier to control.

In FIG. 1B, a low temperature thermal oxidation (dry or wet, preferably wet to lower the temperature) is performed to form a localized high Ge percentage (concentration) SiGe film layer 110 at the bottom interface with little or completely without Ge diffusion through SiGe/Si interface into the substrate 102 at this step. (The top portion of the SiGe film layer 106 and the Si cap layer 108 are converted to the oxide layer 112, while the bottom portion of the SiGe film layer 106 is converted to the high Ge percentage SiGe film layer 110.) This thermal oxidation step can also comprise at least two stages each with different temperatures and durations to ensure little to no Ge diffusion during the process at this step. For example, a first stage can be a 1-hr thermal oxidation at 750° C. and a second stage can be a 2-hr thermal oxidation at 600° C. In general, thermal oxidation processes 500° C.-850° C. can be used for the low temperature thermal oxidation.

In FIG. 1C, a thermal diffusion is performed to form SiGe stressor 114 with the desired profile and depth. Later, the top oxide layer 112 is removed and regular processing can continue. The oxidation and thermal diffusion steps can be combined and performed simultaneously if an optimal temperature can be identified to simultaneously achieve oxidation and desired diffusion profile.

The SiGe film layer 106 has a composition ratio of Si:Ge=1-x: x (i.e., SiGe($Si_{1-x}Ge_x$)), while the condensed SiGe stressor film 114 has a composition ratio of Si:Ge=1-y:y (i.e. SiGe($Si_{1-y}Ge_y$)), where x and y represent the Ge percentage in each SiGe film (y>x). The SiGe stressor layer 114 has a higher Ge concentration than deposited SiGe film layer 106, and applies uniaxial compressive strain to the channel 104.

By having a separate (low-temperature) oxidation step and a Ge diffusion step for the condensation process, a higher Ge concentration profile in SiGe S/D stressor film 114 can be formed and properly controlled from the originally deposited SiGe film 106 having a low Ge concentration percentage. Low temperature thermal oxidation (e.g., below 800° C. for x<0.5 and below 600° C. for x approaching 1, where x is the number in $Si_{1-x}Ge_x$) that does not incur Ge diffusion is to obtain a localized, non-diffused high Ge percentage SiGe film 110. This can be achieved through high water vapor pressure wet oxidation, for example.

The two-step process of oxidation and diffusion eliminates the need for silicon on insulator (SOI) substrate in the conventional condensation process, which relies on the presence of oxide to block uncontrolled Ge diffusion. Disclosed embodiments of the present invention are also applicable to three-dimensional (3D) structures. The condensed high Ge concentration SiGe stressor area 114 is naturally close to the surface channel 104, resulting in effective strain on the device channel. Also, disclosed embodiments of the present invention work on high Ge percentage SiGe channel (e.g., $Si_{0.5}Ge_{0.5}$) devices, which by itself alone cannot compete performance-wise against a typical uniaxial strained Si device without further stress from the S/D.

Figure 2A:
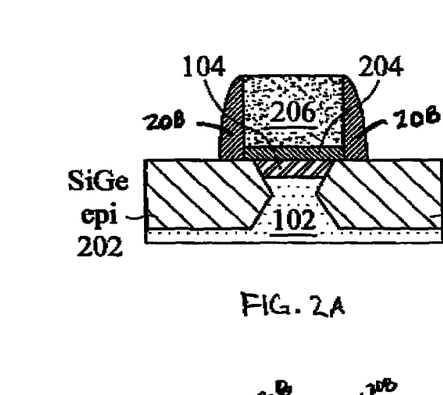
FIG. 2A-FIG. 2F illustrate one embodiment of the process for a planar device with strained source drain (SSD)
Figure 2B:
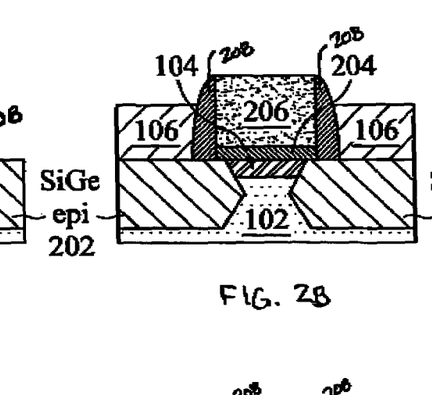
Figure 2C:
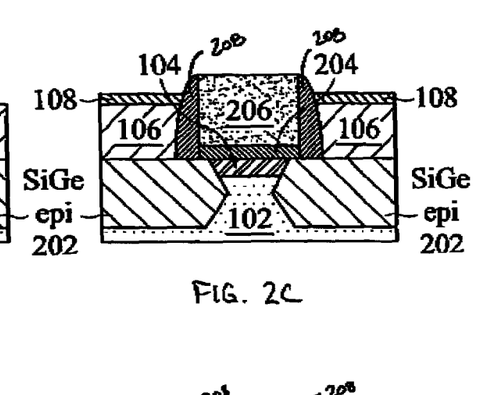
Figures 2D, 2E:
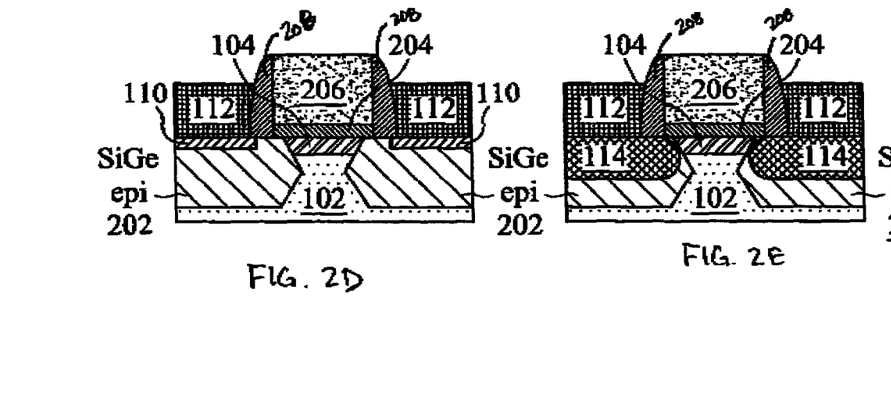
Figure 2F:
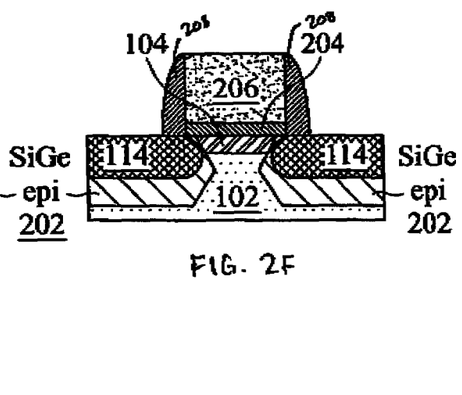

FIGS. 2A-2F illustrate one embodiment of the process for a planar device with strained source drain (SSD). In FIG. 2A, the process starts with SSD and SiGe epi layer 202. The substrate 102, channel 104, dielectric layer 204, gate 206, and sidewall spacer 208 are also shown. In FIG. 2B, a SiGe film 106 (Ge concentration can be either higher or lower than that of 202) is deposited on top of the SiGe epi layer 202. Optionally, a Si cap layer 108 is deposited on top of the SiGe film 106 to help uniform oxidation as shown in FIG. 2C. After low temperature oxidation in FIG. 2D, high Ge percentage SiGe film 110 and oxidation layer 112 are formed. In FIG. 2E, thermal diffusion is performed to form a condensed high Ge concentration SiGe stressor film 114. The Ge concentration of the SiGe film 114 is higher than the original SiGe epi layer 202. In FIG. 2F, the oxide layer 112 can be removed.

Figure 3A:
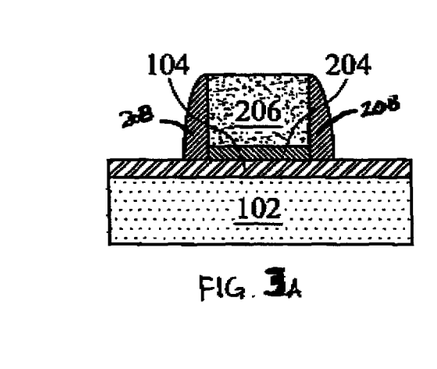
FIG. 3A-FIG. 3F illustrate another embodiment of the process for a planar device without SSD.
Figure 3B:
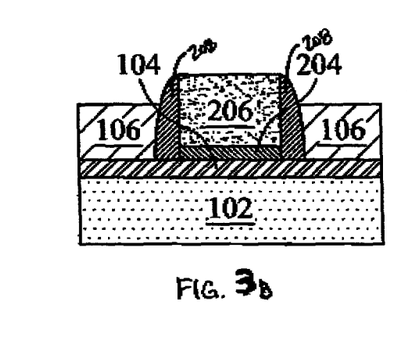
Figure 3C:
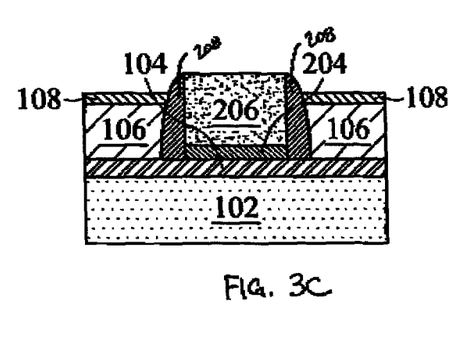
Figure 3D:
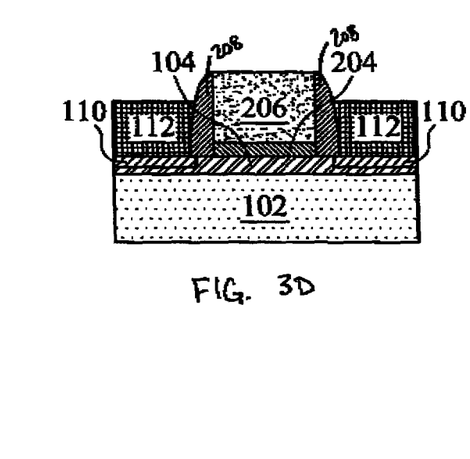
Figure 3E:
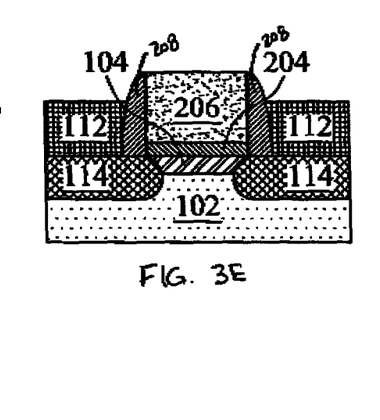
Figure 3F:
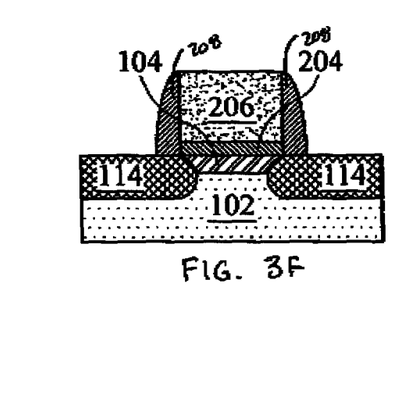

FIGS. 3A-3F illustrate another embodiment of the process for a planar device without SSD according to one aspect of this invention. In FIG. 3A, the process starts without SSD. The substrate 102, the channel layer 104, the dielectric layer 204, the gate 206, and the sidewall spacer 208 are shown. In FIG. 3B, a SiGe film 106 is deposited on top of the channel layer 104. Optionally, a Si cap layer 108 is deposited on top of the SiGe film 106 to help uniform oxidation as shown in FIG. 3C. After low temperature oxidation in FIG. 3D, high Ge percentage SiGe film 110 and oxidation layer 112 are formed. In FIG. 3E thermal diffusion is performed to form a condensed high Ge concentration SiGe stressor 114. In FIG. 3F, the oxide layer 112 can be removed.

Figure 4A:
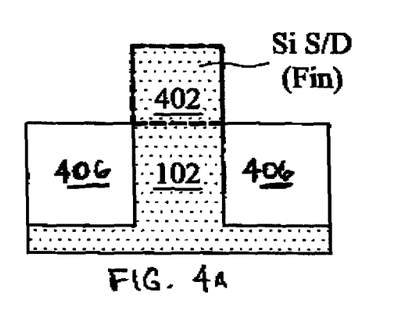
FIG. 4A-FIG. 4F illustrate one embodiment of the process for a FinFET or Trigate device with strained source drain (SSD)
Figure 4B:
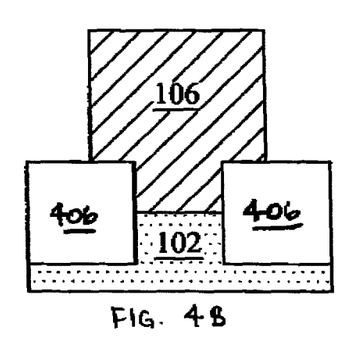
Figure 4C:
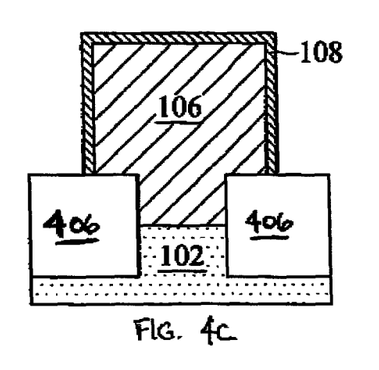
Figure 4D:
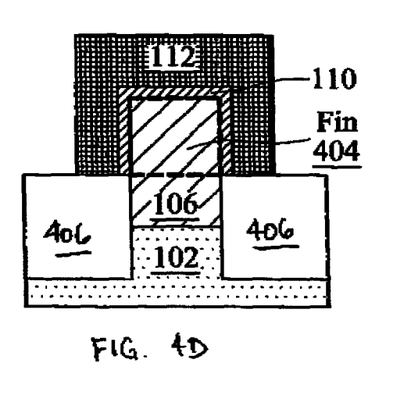
Figure 4E:
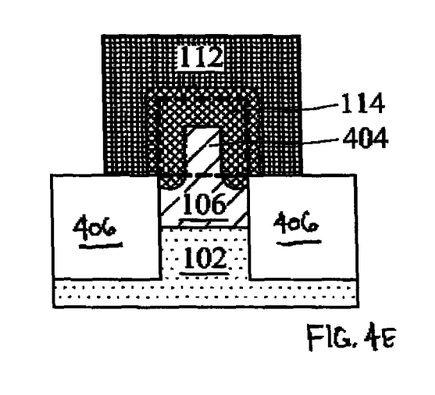
Figure 4F:
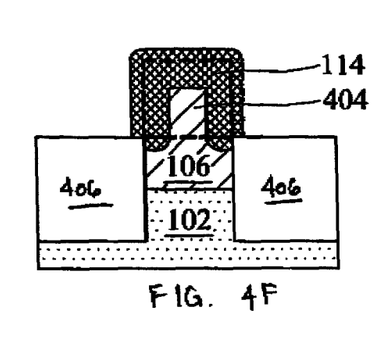

FIGS. 4A-4F illustrate one embodiment of the process for a FinFET device with strained source drain (SSD). FIG. 4A shows a cross section of Si S/D fin area 402 on substrate 102 and shallow trench isolation 406 along a gate direction. In FIG. 4B, anisotropic SSD etch and SiGe epi growth processes are performed on the Si S/D fin area 402 on top of Si substrate 102 to form SiGe film layer 106. In FIG. 4C, a Si cap layer 108 can be optionally deposited on top of the SiGe film 106 to help uniform oxidation. After low temperature oxidation in FIG. 4D, high Ge percentage SiGe film 110 and oxidation layer 112 are formed over the fin area 404. In FIG. 4E, thermal diffusion is performed to form a condensed high Ge concentration SiGe stressor 114. The Ge concentration of the SiGe stressor 114 is higher than the SiGe film 106. It is also possible that the entire S/D area, 404, is uniformly converted to higher Ge concentration SiGe (i.e., 404=114). In FIG. 4F, the oxide layer 112 can be removed.

Figure 5A:
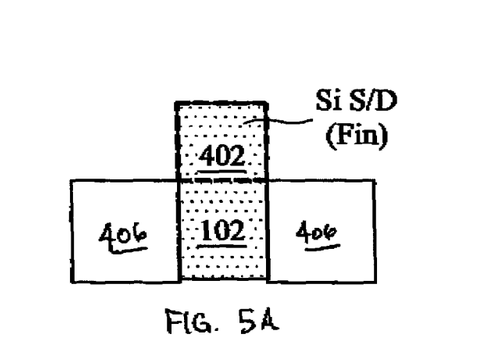
FIG. 5A-FIG. 5F illustrate another embodiment of the process for a FinFET or Trigate device without SSD.
Figure 5B:
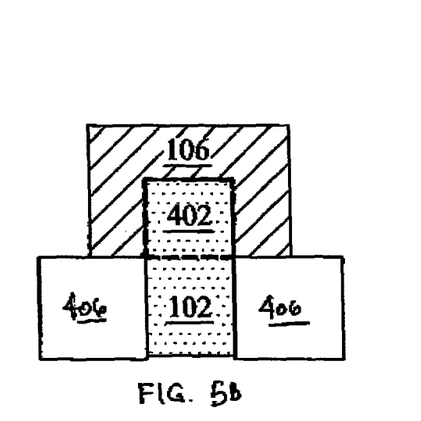
Figure 5C:
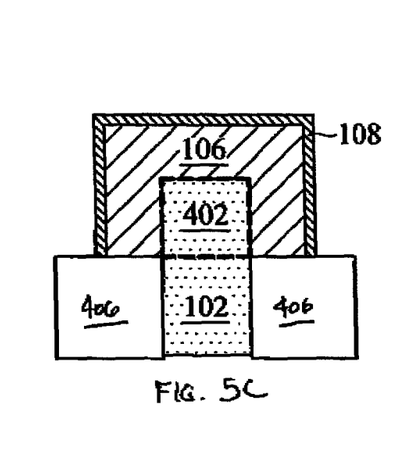
Figure 5D:
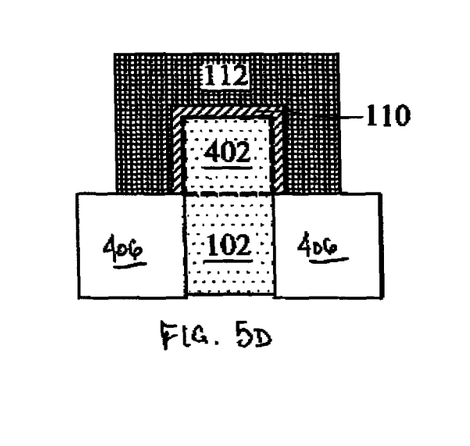
Figure 5E:
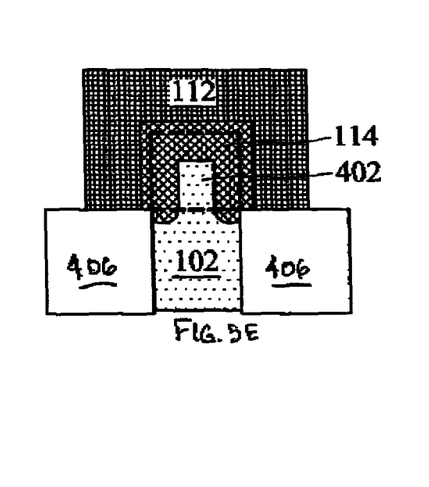
Figure 5F:
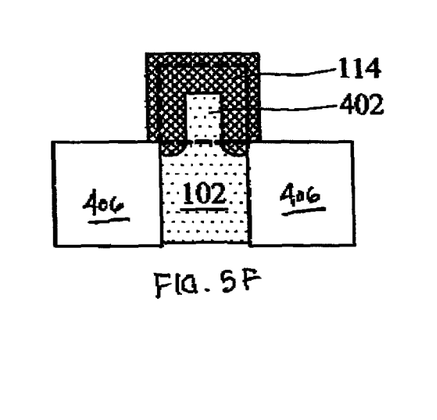

FIGS. 5A-5F illustrate another embodiment of the process for a FinFET device without SSD. FIG. 5A shows a cross section of Si S/D fin area 402 on substrate 102 and shallow trench isolation 406 along a gate direction. In FIG. 5B, a SiGe film layer 106 is grown over the Si S/D Fin area 402 on top of Si substrate 102. In FIG. 5C, a Si cap layer 108 can be optionally deposited on top of the SiGe film 106 to help uniform oxidation. After low temperature oxidation in FIG. 5D, high Ge percentage SiGe film 110 and oxidation layer 112 are formed over the fin area 402. In FIG. 5E, thermal diffusion is performed to form a condensed high Ge concentration SiGe stressor 114. The Ge concentration of the SiGe stressor 114 is higher than the SiGe film 106. Again, it is possible that the entire S/D area, 404, is uniformly converted to higher Ge concentration SiGe. In FIG. 5F, the oxide layer 112 can be removed.

The advantageous features of disclosed embodiments of the present invention include much higher uniaxial compressive stress on the channel achieved without redeveloping a SiGe process that relieves the pressure of forming higher and higher Ge concentration SiGe film with epitaxy, and the elimination of critical thickness constraint, i.e., strained source drain (SSD) depth. Also, the present methods can provide a uniaxial strain from higher Ge concentration SiGe S/D on the SiGe channel, in addition to the biaxial strain from the SiGe channel on Si substrate (e.g., $Si_{0.5}Ge_{0.5}$ channel with SiGe S/D having Ge greater than 50%).

In some embodiments, a method to form a SiGe stressor with high Ge concentration includes providing a semiconductor substrate with a source area, a drain area, and a channel between the source area and the drain area; depositing the SiGe film layer on the source area and/or the drain area; performing a low temperature thermal oxidation to form an oxide layer at the top of the deposited SiGe layer and to convert the bottom of the deposited SiGe film to a high Ge percentage SiGe film without Ge diffusion into the Si substrate; performing a thermal diffusion to form the SiGe stressor from the converted high Ge percentage SiGe film layer, wherein the SiGe stressor provides uniaxial compressive strain on the channel; and removing the oxide layer.

The method can further include depositing an additional Si cap layer on the SiGe film layer prior to performing the low temperature thermal oxidation. The low temperature thermal oxidation can be performed, as an example but not limited to, using a high water vapor pressure wet oxidation process. The low temperature thermal oxidation can have at least two stages with different temperatures and durations. The low temperature thermal oxidation and the thermal diffusion can be two separated steps or can be performed simultaneously. An additional SiGe film layer can be deposited on the SiGe source area and/or the drain area that are formed by traditional epitaxial method or the previously stated condensation method. The Ge concentration of the deposited SiGe film can be either higher or lower than the Ge concentration of the SiGe source/drain. After the process of the present invention, the Ge concentration in the SiGe source/drain area will be higher than its previous value.

In some embodiments, the channel can comprise SiGe. The Si substrate can apply bi-axial strain on the SiGe channel. Using the method stated in this invention, the Ge concentration of the SiGe stressor can be higher than the Ge concentration of the channel to which an additional uni-axial strain is applied from the stressor. For example, the channel can comprise $Si_{0.5}Ge_{0.5}$, and/or the SiGe stressor can have more than 50% Ge.

A skilled person in the art will appreciate that there can be many embodiment variations. Although exemplary embodiments of the present invention and their advantages have been described in detail, it should be understood that various changes, substitutions and alterations can be made herein without departing from the spirit and scope defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for forming a SiGe stressor, said method comprising:
   depositing a first SiGe layer in at least one of a source area and a drain area on a semiconductor substrate having a channel between the source area and the drain area; and
   performing a thermal oxidation to convert a top portion of the first SiGe layer to an oxide layer and a bottom portion of the first SiGe layer to a second SiGe layer; and
   performing a separate thermal diffusion process after the thermal oxidation is performed, to form a SiGe stressor from the second SiGe layer, wherein the second SiGe layer has a higher Ge concentration than the first SiGe layer.

2. The method of claim 1, further comprising, prior to the converting the top portion of the first SiGe layer to the oxide layer and the bottom portion of the first SiGe layer to the second SiGe layer, depositing a Si cap layer on the first SiGe layer.

3. The method of claim 1, wherein the thermal oxidation is performed using a water vapor pressure wet oxidation process.

4. The method of claim 1, wherein the thermal oxidation includes at least two stages each utilizing different temperatures and durations.

5. The method of claim 1, wherein the thermal oxidation has a process temperature about 600° C.-800° C.

6. The method of claim 1, wherein the channel comprises SiGe and the Ge concentration of the second SiGe layer is higher than the channel.

7. The method of claim 1, wherein the semiconductor substrate comprises Si, SiGe, or relaxed SiGe film on Si.

8. A method for forming a SiGe stressor, comprising:
   depositing a first SiGe layer in at least one of a source area and a drain area on a semiconductor substrate having a channel between the source area and the drain area;
   depositing a Si cap layer on the first SiGe layer; and
   performing a thermal oxidation to convert a top portion of the first SiGe layer and the Si cap layer to an oxide layer and to convert a bottom portion of the first SiGe layer to a second SiGe layer; and
   performing a separate thermal diffusion process after the thermal oxidation is performed to form a SiGe stressor from the second SiGe layer, wherein the second SiGe layer has a higher Ge percentage than the first SiGe layer.

9. The method of claim 8, wherein the thermal oxidation is performed using a water vapor pressure wet oxidation process.

10. The method of claim 8, wherein the thermal oxidation includes at least two stages each utilizing different temperatures and durations.

11. The method of claim 8, wherein the thermal oxidation has a process temperature about 600° C.-800° C.

12. The method of claim 8, wherein the channel comprises SiGe and a Ge concentration of the SiGe stressor is higher than a Ge concentration of the channel.

13. The method of claim 8, wherein the semiconductor substrate comprises Si, SiGe, or relaxed SiGe film on Si.

14. The method of claim 1, wherein the thermal diffusion process causes greater Ge diffusion into the semiconductor substrate than the thermal oxidation.

15. The method of claim 1, wherein the thermal oxidation causes no Ge diffusion into the semiconductor substrate.

16. The method of claim 8, wherein the thermal diffusion process causes greater Ge diffusion into the semiconductor substrate than the thermal oxidation.

17. The method of claim 8, wherein the thermal oxidation causes no Ge diffusion into the semiconductor substrate.

18. A method for forming a SiGe stressor, said method comprising:

depositing a first SiGe layer on a semiconductor substrate; and performing a thermal oxidation to convert a top portion of the first SiGe layer to an oxide layer and a bottom portion of the first SiGe layer to a second SiGe layer; and after the thermal oxidation is performed, performing a separate thermal diffusion process to form a SiGe stressor from the second SiGe layer, wherein the second SiGe layer has a higher Ge concentration than the first SiGe layer, and the thermal diffusion process causes greater Ge diffusion into the semiconductor substrate than the thermal oxidation.

19. The method of claim 18, wherein the thermal oxidation causes no Ge diffusion into the semiconductor substrate.

20. The method of claim 18, further comprising, prior to the thermal oxidation, depositing a Si cap layer on the first SiGe layer.

* * * * *